United States Patent
Foursa (10) Patent No.: US 11,211,775 B2
(45) Date of Patent: Dec. 28, 2021

(54) REDUNDANCY IMPROVEMENT IN SEMICONDUCTOR-BASED OPTICAL COMMUNICATION SYSTEMS

(71) Applicant: Subcom, LLC, Eatontown, NJ (US)

(72) Inventor: Dmitri G. Foursa, Colts Neck, NJ (US)

(73) Assignee: Subcom, LLC, Eatontown, NJ (US)

( * ) Notice: Subject to any disclaimer, the term of this patent is extended or adjusted under 35 U.S.C. 154(b) by 137 days.

(21) Appl. No.: 16/540,743

(22) Filed: Aug. 14, 2019

(65) Prior Publication Data

US 2021/0050714 A1 Feb. 18, 2021

(51) Int. Cl.
*H01S 5/50* (2006.01)
*H04B 10/29* (2013.01)
*H04B 10/50* (2013.01)
*H04B 10/572* (2013.01)
*H04B 10/67* (2013.01)

(52) U.S. Cl.
CPC ............ *H01S 5/50* (2013.01); *H04B 10/29* (2013.01); *H04B 10/506* (2013.01); *H04B 10/572* (2013.01); *H04B 10/674* (2013.01)

(58) Field of Classification Search
None
See application file for complete search history.

(56) References Cited

U.S. PATENT DOCUMENTS

| | | | | |
|---|---|---|---|---|
| 6,301,037 B1 * | 10/2001 | Fischer | ................ | H04B 10/11 398/101 |
| 6,477,287 B1 * | 11/2002 | Hait | ...................... | G02B 6/272 385/14 |
| 6,906,856 B1 * | 6/2005 | DiJaili | ................. | H01S 5/0021 359/337 |
| 2007/0183023 A1 | 8/2007 | Iannone et al. | | |
| 2009/0238574 A1 | 9/2009 | Sone | | |
| 2013/0279910 A1 * | 10/2013 | Ziari | ..................... | H04J 14/02 398/65 |

FOREIGN PATENT DOCUMENTS

JP 2000209151 A 7/2000

OTHER PUBLICATIONS

EP Search dated Jan. 21, 2021, from EP Patent Application No. 20190325.9, filed on Aug. 10, 2020, 10 pages.
Budd Russell A et al.: "Semi conductor optical amplifier (SOA) packaging for scalable and gain-integrated silicon photonic switching platforms", 2015 IEEE 65th Electronic Components and Technology Conference (ECTC), IEEE, May 26, 2015 (May 26, 2015), pp. 1280-1286, XP033175216, DOI: 10.1109/ECTC.2015.7159762 [retrieved on Jul. 15, 2015].

* cited by examiner

*Primary Examiner* — David W Lambert
(74) *Attorney, Agent, or Firm* — Kacvinsky Daisak Bluni PLLC (57) ABSTRACT

Techniques for improving redundancy in semiconductor-based optical communication systems are provided. For example, two or more semiconductor optical amplifiers (SOAs) may be provided in an optical repeater, and each SOA may form a respective amplification path. When failure occurs on a first SOA, a second SOA that is different from the first SOA can be selected. In one example, the selection may be based on wavelength division multiplexing (WDM), and in another example, the selection may be based on optical switching. The two or more SOAs (and other optical components) may be integrated in the same substrate package.

12 Claims, 5 Drawing Sheets

REDUNDANCY IMPROVEMENT IN SEMICONDUCTOR-BASED OPTICAL COMMUNICATION SYSTEMS

BACKGROUND OF THE INVENTION

Field of the Invention

Embodiments of the present disclosure relate to the field of optical communication systems. More particularly, the present disclosure relates to improving redundancy in optical communication systems that include semiconductor-based components.

Discussion of Related Art

Long-haul optical communication systems, such as submarine optical communication systems, generally suffer from signal attenuation resulting from a variety of factors, including scattering, absorption, and bending. To compensate for attenuation, these long-haul systems may include a series of optical amplifiers or "repeaters" that are spaced along the transmission path between a transmitter and a receiver. The repeaters amplify the optical signal in a manner that allows reliable detection at the receiver. Typically, multiple repeaters are positioned along the transmission path depending on the length of the optical communication system.

Examples of commonly used optical amplifiers in long-haul optical communication systems include Raman amplifiers, which involve amplifying optical signals based on the stimulated Raman scattering (SRS) phenomenon, and erbium doped fiber amplifiers (EDFAs), which may include core erbium-doped optical fibers that are pumped with light from laser diodes to amplify optical signals. Other types of optical amplifiers based on different doped active fibers are also possible. These include but not limited to Praseodymium-doped, Bismuth-doped and Thulium-doped fiber amplifiers. Another type of optical amplifier is the semiconductor optical amplifier (SOA), which may be configured to amplify incident light through stimulated emission. For instance, when light travels through an active region of an SOA, it may cause electrons to lose energy in the form of photons and return to ground state. The "stimulated" photons may have the same wavelength as the optical signal, which effectively amplifies the optical signal.

Although SOAs are typically used in telecommunication systems, they may be implemented in long-haul optical communication systems, which may include terrestrial and submarine applications. One example disadvantage of SOAs, however, is that they are functionally "all-or-nothing" types of amplifiers. For example, if a portion of an SOA fails, the entire SOA may fail. Moreover, if no current is being applied to the SOA, the SOA may be entirely inoperative. Thus, system-implemented SOAs can become highly opaque within the system when they are inoperative or in failure mode. Accordingly, there is a need to design semiconductor-based communication systems, such as SOA-implemented systems, with sufficient redundancy mechanisms so that they can operate over their required system lifespans.

SUMMARY OF THE INVENTION

Embodiments of the present disclosure are directed to techniques for improving redundancy in semiconductor-based optical communication systems. In one embodiment, an apparatus may include at least wavelength division multiplexing (WDM) circuitry, a first semiconductor optical amplifier (SOA) and a second SOA. The first SOA may correspond to a first operation wavelength and the second SOA may correspond to a second operation wavelength. The WDM circuitry may be configured to receive an optical signal at the first operation wavelength and provide the received optical signal to the first SOA for amplifying the optical signal or may be configured to receive the optical signal at the second operation wavelength and provide the received optical signal to the second SOA for amplifying the optical signal.

In another embodiment, an apparatus includes at least optical switching circuitry, a first SOA and a second SOA, where the first and second SOAs are coupled to the optical switching circuitry. The optical switching circuitry may be configured to receive an optical signal and provide the received optical signal to the first SOA for amplifying the optical signal or may be configured to receive the optical signal and provide the received optical signal to the second SOA for amplifying the optical signal.

In yet another embodiment, a substrate package may include at least one optical combiner, at least one optical switch, a first SOA, and a second SOA. The first and second SOA may be coupled to the at least one optical combiner and the at least one optical switch. Moreover, the at least one optical combiner, the at least one optical switch, the first SOA, and the second SOA may be integrated in the substrate package. The at least one optical switch may be configured to provide an optical signal to the first SOA or the second SOA for amplifying the optical signal.

In a further embodiment, a method may include transmitting a first optical signal to an optical repeater, the optical repeater including at least a first SOA and a second SOA, where the first SOA amplifies the transmitted first optical signal. The method may further include determining that the first SOA in the optical repeater is not functional or is in failure mode, selecting the second SOA or switching to the second SOA, and transmitting a second optical signal such that the second SOA amplifies the second optical signal.

DESCRIPTION OF EMBODIMENTS

The present invention is directed to improving redundancy in semiconductor-based communication systems. For example, improved redundancy may be achieved by implementing two or more semiconductor optical amplifiers (SOAs), which respectively form two or more different amplification paths. The two or more SOAs may be implemented in the same optical repeater. According to one embodiment, wavelength division multiplexing (WDM) may be used to select a specific SOA amplification path by transmitting, via a transmitter, an optical signal at a predefined operation wavelength. According to another embodiment, an optical switch connecting the two or more SOAs may be used to select a particular amplification path. According to a further embodiment, two or more SOAs may be integrated in a substrate package along with other optical components, such as a combiner, an optical switch, etc., thereby increasing overall efficiency at least on the component-level within the system.

As described above, SOAs may be "all-or-nothing" components and, when implemented in a long-haul optical communication system, their failure in the system may cause numerous problems. Accordingly, the examples and/or embodiments described herein overcome the aforementioned problems associated with SOA-based (or any other semiconductor-based) optical communication systems. One advantage of the invention is that by providing two or more different amplification paths for amplifying an optical signal, signal amplification is not disrupted when failure occurs on one of those paths. Signal amplification on the paths can easily be switched using WDM or optical switching mechanisms. Another advantage of the invention is the implementation of the two or more SOAs and other optical components in the same substrate package, which improves efficiency and redundancy at least on the component level within the optical communication system.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 1:
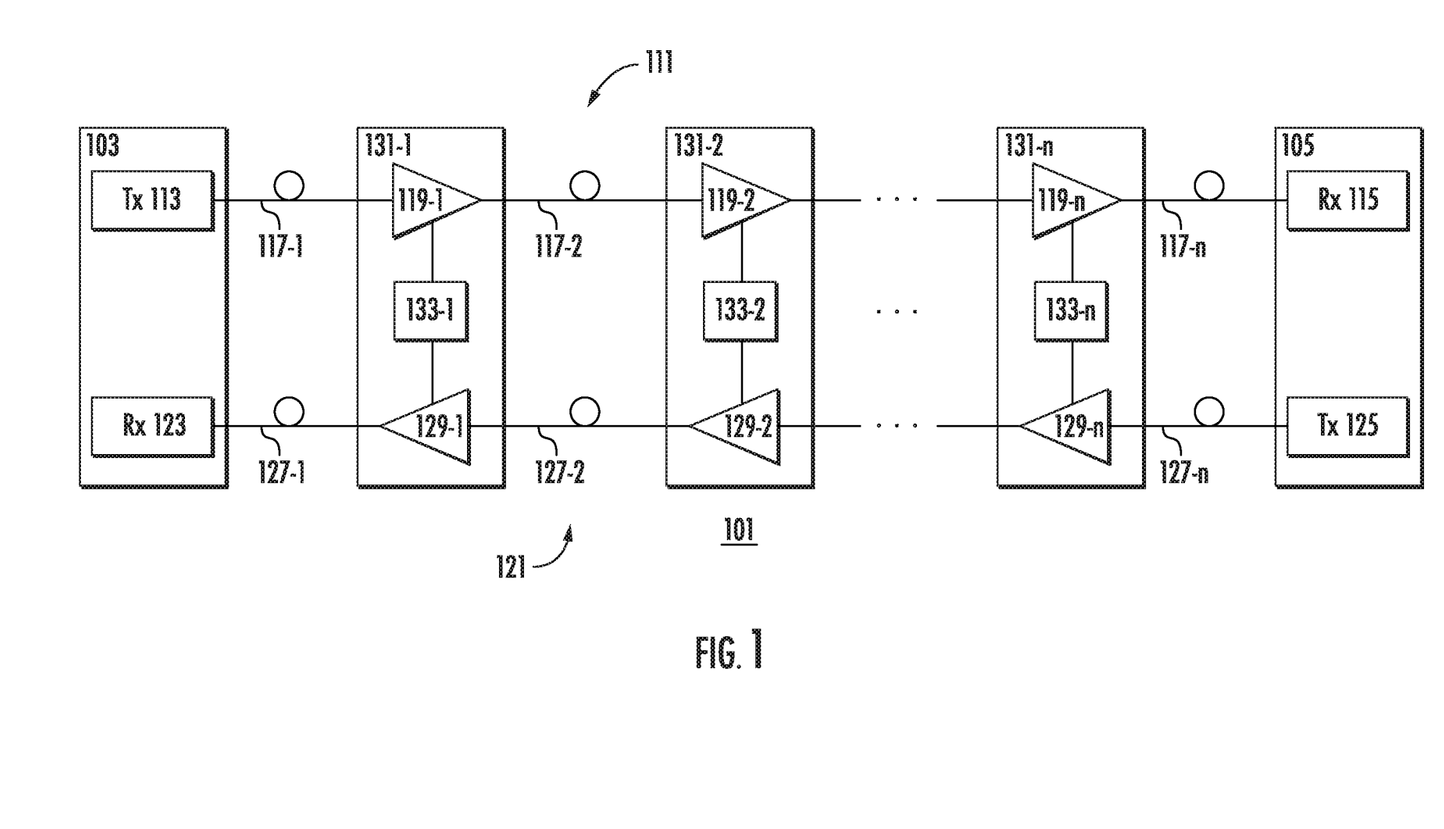
FIG. 1 illustrates an example optical communication system.

Referring to the drawings, FIG. 1 illustrates an example bi-directional optical communication system 101. The bi-directional optical communication system 101 may use high-bandwidth fiber optics to transmit vast amounts of data over long distances. Bi-directional data transmission may be implemented by constructing pairs of optical fiber paths within the optical fibers and transmitting one or more channels, e.g., wavelength division multiplexed channels, per fiber pair.

As shown, the optical communication system 101 may include terminals 103 and 105 connected by two unidirectional optical paths 111, 121, which together form a bi-directional optical path pair. Optical path 111 may transmit information in one direction (e.g., to the right) from a transmitter 113 at terminal 103 to a receiver 115 at terminal 305. Optical path 121 may transmit information in the other direction (e.g., to the left) from a transmitter 125 at terminal 105 to a receiver 123 at terminal 103. With respect to terminal 103, the optical path 111 is an outbound path and the optical path 121 is an inbound path. The optical path 111 may include optical fibers 117-1 to 117-n and optical amplifiers 119-1 to 119-n, and the optical path 121 may include optical fibers 127-1 to 127-n and optical amplifiers 129-1 to 129-n. It may be understood that, in some examples, transmitter 113 and receiver 123 may be housed together as a transponder at terminal 103, and similarly, transmitter 115 and receiver 125 may also be housed together as a transponder at terminal 105.

The optical path pair (e.g., optical paths 111, 121) may be configured as a set of amplifier pairs 119-1 to 119-n and 129-1 to 129-n within repeaters 131-1 to 131-n connected by pairs of optical fibers 117-1 to 117-n and 127-1 to 127-n, which may be included in an optical fiber cable together with fibers supporting additional path pairs. Each repeater 131 may include a pair of amplifiers 119, 129 for each path pair and may include additional amplifiers for additional path pairs. The optical amplifiers 119, 129 may utilize EDFAs or other rare earth doped fiber amplifiers, Raman amplifiers, or semiconductor optical amplifiers (SOAs). A coupling path 133-1 to 133-n may be coupled between optical paths 111, 121, for example, in one or more of the repeaters 131-1 to 131-n. It may be understood that the term "couple" or "coupled," used herein, refers to either a direct or indirect connection and/or a wired or wireless connection and not intended to be limiting in any manner.

Although an exemplary embodiment of the optical communication system 101 is shown and described, variations of the optical communication system 101 are within the scope of the present disclosure. The optical communication system 101 may include, for example, more optical path pairs and more or fewer repeaters. Alternatively, the optical communication system 101 may not include any optical amplifiers or may include, instead of optical amplifiers, optical pump power sources suitable for implementing optical gain by Raman amplification within optical fibers connecting repeaters.

Moreover, it may be understood that the transmitters, receivers, transponders containing the transmitters and receivers, or any other suitable device for transmitting and receiving data, may be include at least one memory and one or more processors (e.g., CPU, ASIC, FGPA, any conventional processor, etc.) to execute instructions stored in memory, for example, to identify and locate external aggressions based on State-of-Polarization (SOP) analyses, as will be further described below.

Figure 2A:
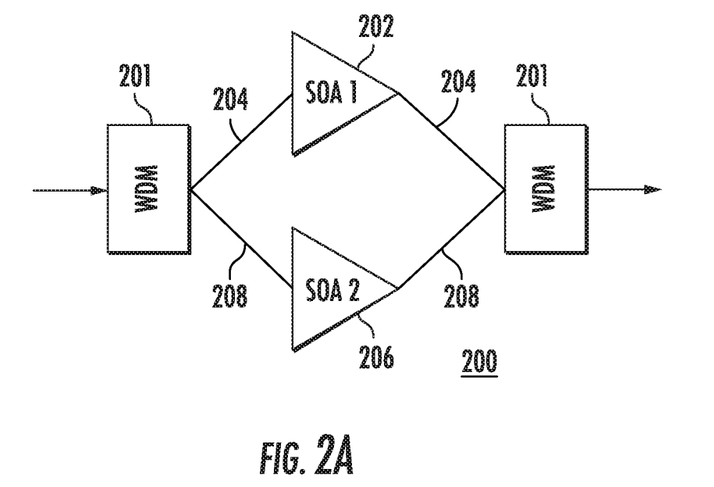
FIGS. 2A-B illustrate example redundancy configurations using WDM.

FIG. 2A illustrates an example wavelength division multiplexing (WDM) redundancy configuration 200 according to embodiments. The WDM redundancy configuration 200 may be implemented in an optical repeater. As shown, the redundancy configuration 200 in the repeater may include WDM circuitry 201, two separate SOAs 202 and 206, which may form two separate amplification paths 204 and 208, respectively. Thus, when amplification path 202 is used as a primary path, the amplification path 208 may be considered a redundant path (or vice versa).

In one example, WDM communication may be used by one or more transponders to transmit one or more optical signals. The use of WDM communication may allow a transmitter at the one or more transponders to transmit optical signal(s) at a predetermined wavelength. SOA 202 and SOA 206 may each correspond to a predetermined operation wavelength. Thus, for instance, when the WDM circuitry 201 receives an optical signal (or portions thereof) at an operation wavelength or wavelength range corresponding to SOA 202, only SOA 202 may be used to amplify the optical signal. Similarly, when the WDM circuitry 201 receives an optical signal at an operation wavelength or wavelength range corresponding to SOA 206, only SOA 206 may be used to amplify the optical signal.

Accordingly, a specific optical amplification path (e.g., path 204 or path 208) can be selected for amplifying the optical signal by transmitting an optical signal at a specific operation wavelength or wavelength range corresponding to the SOA associated with that amplification path. It may be understood that the operation wavelength or wavelength range corresponding to SOA 202 is different from the operation wavelength or wavelength range corresponding to SOA 206. It may be further understood that the corresponding operation wavelengths or wavelength ranges may be selected from any suitable electromagnetic spectrum, e.g., EU/NATO/US ECM radio bands (A to N bands), ITU radio bands, IEEE radio bands (HF, VHF, UHF, L, S, C X, K, V, W, mm, etc.).

According to an embodiment, electrical power efficiency may be improved by switching on only one SOA in the repeater while switching off the other SOAs. Thus, when an SOA in the repeater fails or is inoperative (e.g., SOA 202), an "unused" or unpowered SOA (e.g., SOA 206) may be switched "on" by configuring or tuning the transmitter to transmit the optical signal at the operation wavelength or wavelength range corresponding to the unused or unpowered SOA. In some examples, a transmitting band may be selected by switching a drive current on or off to the corresponding SOAs.

There are numerous advantages to implementing a WDM-based redundancy configuration in the repeater, such as minimizing insertion losses, eliminating additional active optical components, and having minimum impact on the noise figure (NF) of the amplifier. Another advantage may be that the output WDM signal can be substituted by a passive optical combiner without penalty to the NF when the power budget permits extra losses in the system.

Figure 2B:
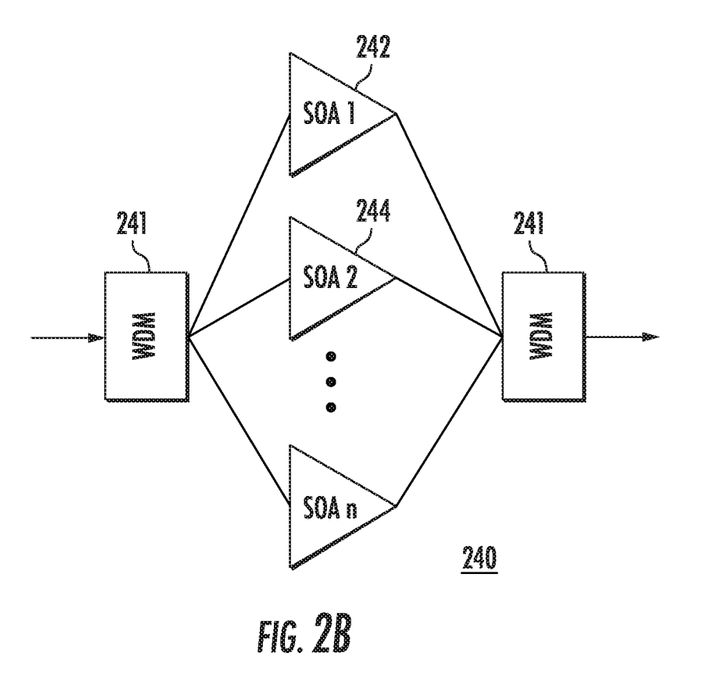

FIG. 2B illustrates another example of a redundancy configuration 240 according to embodiments. As shown, the configuration 240 is similar to the redundancy configuration 200 of FIG. 2A, except in FIG. 2B, more than two SOAs (e.g., SOAs 242 and 244 and up to an "n" number of SOAs) may be arranged in an optical repeater. Each of the SOAs 242, 244, and SOA n may correspond to a respective operation wavelength or wavelength range. Thus, when the WDM circuitry 241 receives an optical signal transmitted at a particular operation wavelength or wavelength range corresponding to an SOA, the WDM circuitry 241 may select that SOA to amplify the optical signal, as described above. Moreover, similar to the redundancy configuration 200 of FIG. 2A, only SOA may be turned on at a time to conserve power.

Figure 3:
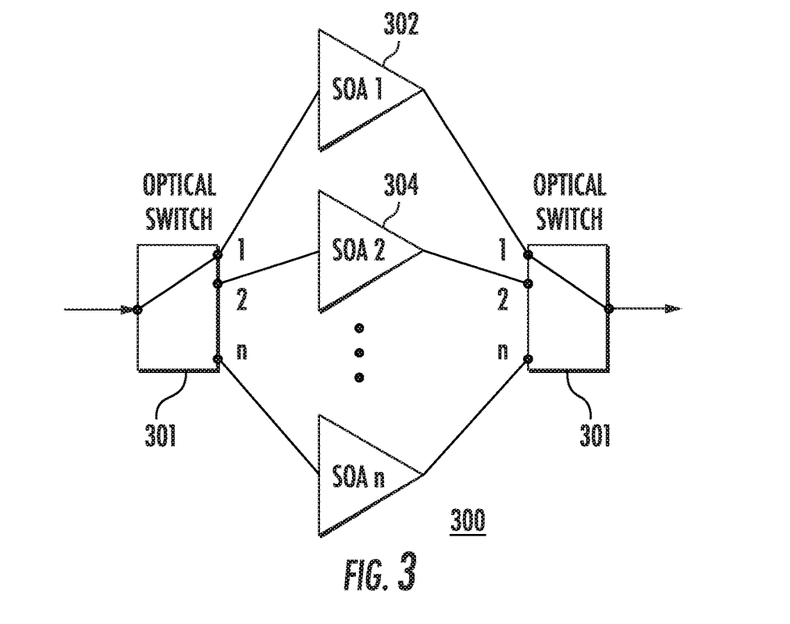
FIG. 3 illustrates an example redundancy configuration using an optical switch.

FIG. 3 illustrates an example optical switch redundancy configuration 300 according to embodiments. The optical switch redundancy configuration 300 may be implemented in an optical repeater. As shown, one or more optical switches or optical switching circuitry 301 may be coupled to two or more SOAs 302, 304, up to SOA "n." While two separate optical switches are illustrated in FIG. 3, it may be understood that one optical switch may perform the functionalities of the two switches, or it may be further understood that the two optical switches may be arranged in one optical switching circuitry package.

According to an exemplary embodiment, the optical switching circuitry 301 may be configured to select, or switch to, an SOA without restriction to a particular bandwidth. Moreover, as described above with the example redundancy configurations 200 and 240 of FIGS. 2A and 2B, respectively, only one SOA (e.g., the SOA in operation) may be turned "on" while the other SOAs may be turned off in order to maintain power efficiency within the optical repeater. In some examples, the optical switching circuitry may also be configured to switch the drive currents to the SOAs.

In one example, when SOA 302 fails or is inoperative, the optical switching circuitry 301 may select and/or switch to a functional SOA (e.g., SOA 304, SOA n). It may be understood that a passive optical combiner may be used at the output without penalty to the noise figure (NF) when the power budget permits extra losses in the associated system.

Figure 4:
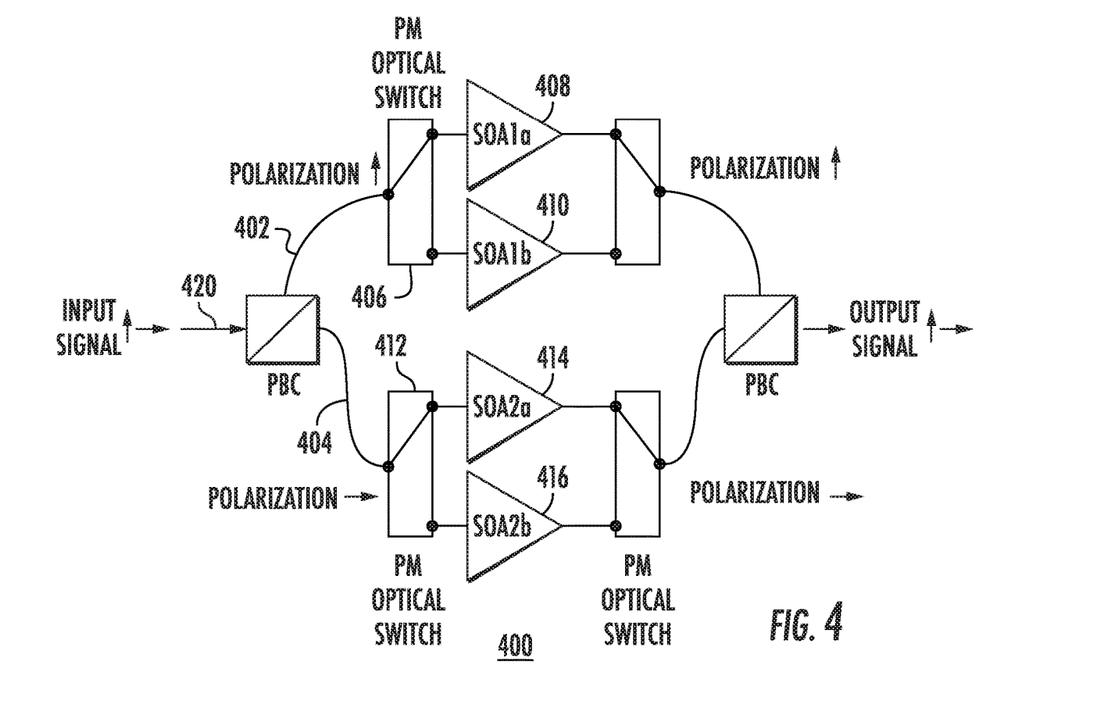
FIG. 4 illustrates an example redundancy configuration using an optical switch with polarization multiplexing.

FIG. 4 illustrates an example redundancy configuration using an optical switch combined with polarization multiplexing according to embodiments. According to an exemplary embodiment, for each of the two shown amplification paths (e.g., vertical-polarization amplification path 402, horizontal-polarization amplification path 404), redundancy may be achieved by implementing two or more SOAs coupled to an optical switch, which may be a polarization maintaining (PM) component.

For example, a PM optical switch 406 may be configured to select, or switch between, SOA 408 or SOA 410 for amplifying an optical signal that may be input at a polarization beam combiner (PBC) 420. Similarly, in a further example, a PM optical switch 412 may be configured to select, or switch between, SOA 414 or SOA 416 for amplifying the optical signal. In at least that regard, redundancy may be achieved by way of the PM optical switches and the respective SOAs when amplifying the optical signal using polarization multiplexing. In some examples, the PM optical switches 406 and 412 may also be configured to drive current to the respective SOAs. Moreover, it may be understood that in addition to optical switching techniques, redundancy may also be achieved using WDM and integration SOA integration (which will be further described below) for each polarization of the optical signal.

Figure 5:
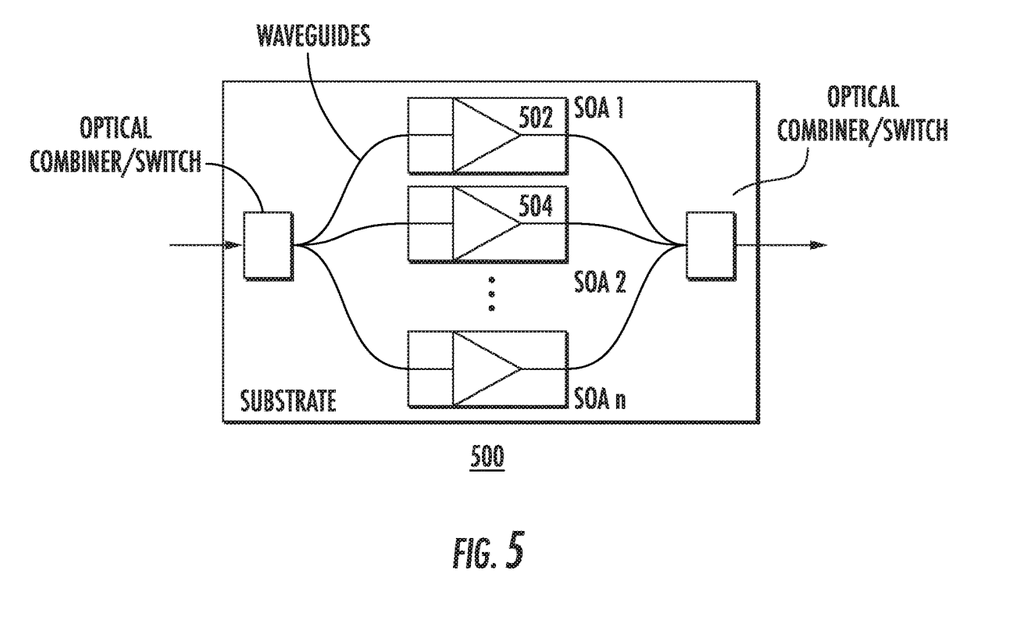
FIG. 5 illustrates an example redundancy configuration using SOA integration.

FIG. 5 illustrates an example redundancy configuration 500 using SOA integration according to embodiments. As shown, two or more SOAs (e.g., SOA 502, SOA 504, SOA "n") may be integrated in a same substrate package. For example, SOA integration techniques may include photonics integration, which may be performed using various methods, e.g., InP integration, Si integration, Ge—Si integration, heterogenous integration, etc. It may be understood that one or more of the SOA integrated packages or substrates, such as the one shown in FIG. 4 having the redundancy configuration 500, may be implemented or arranged in repeaters of an optical communication system.

According to one embodiment, one or more switching mechanisms may also be implemented within the same SOA integration process. For example, a switching mechanism may be in the form of optical switching, e.g., 1×N and/or N×1 optical switching. In another example, the switching mechanism can be WDM combining or any other suitable form of combining optical paths. In yet a further example, polarization combining may be performed by using polarization beam combiners and active polarization rotators that effectively function as a switch. Similar to the above described examples, the selection of an optical amplification path may be performed by switching between the SOAs. In a different example, specific SOAs may be turned on or turned off to achieve the switching effect. It may be understood that passive or active optical combining may be used based at least on the optical power budget, system requirements, and system complexity level.

In an exemplary embodiment, SOA 502 may be switched on while the other SOAs in each repeater are turned off. In the event of SOA failure in one or more repeaters of the system, such as SOA 502, the current to SOA 502 may be turned off and the power to one or more redundant SOAs (e.g., SOAs 504, SOA n) may be turned on. As described, in some examples, switching may be performed by selectively turning on or turning off specific SOAs. In different examples, switching may be performed via one or more optical switches or optical switching circuitry.

Figure 6:
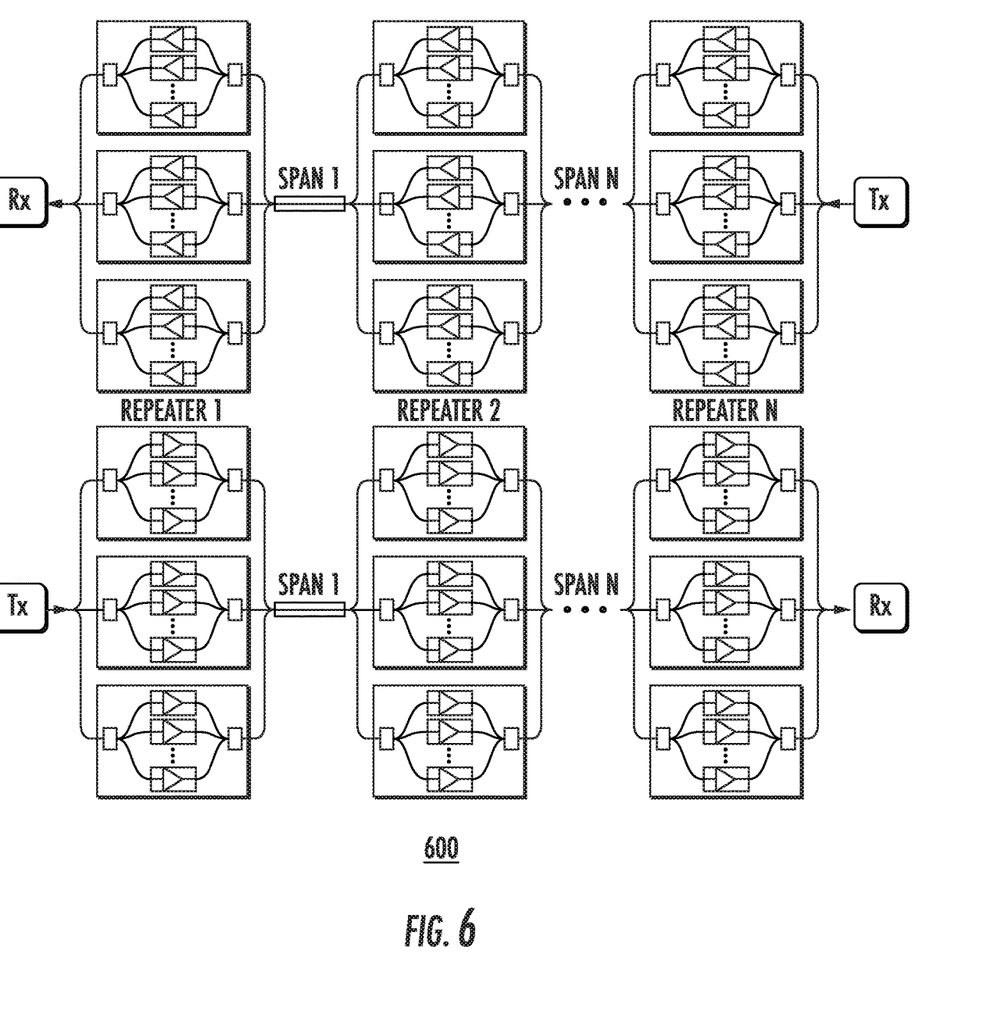
FIG. 6 illustrates an example redundancy configuration for multiple fiber pairs.

FIG. 6 illustrates an example redundancy configuration 600 for an optical digital transmission line having three separate fiber pairs according to embodiments. Each fiber pair includes a receiver fiber and a transmitter fiber. Moreover, although three fiber pairs are shown in FIG. 6, it may be understood that more or less fiber pairs may be implemented.

As illustrated, the number of amplification paths in each fiber pair may depend on the number of amplifiers, which may be one or more SOAs. In exemplary embodiments, two or more SOAs per optical path (e.g., a path associated with a repeater) may be used for redundancy and overall improvement in system reliability. The redundancy configurations may be based on any of the examples or embodiments discussed above, e.g., WDM, optical switching, SOA integration. In some examples, a command control channel may be included in the optical digital transmission line, e.g., for redundancy configurations using optical switching and SOA integration with an optical combiner and/or optical switch.

In one or more of the above-described redundancy configurations, adjustment of gain and gain tilt may be accomplished by temperature control of the SOA and/or drive current. This may allow gain setting in the system and adjustment for aging effects and repairs in the transmission line. Adjustment of the temperature assumes implementation of temperature control of the SOAs and command-control feature of all repeaters or a fraction of repeaters in the system. Other ways to control the overall gain of the SOA may be used, including but not limited to variable optical attenuators and optical switches with pre-determined optical attenuators or optical filters.

Herein, a novel and inventive apparatus, system, and method for improving redundancy in semiconductor-based communication systems are disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
wavelength division multiplexing (WDM) circuitry;
a first semiconductor optical amplifier (SOA), wherein the first SOA corresponds to a first operation wavelength; and
a second SOA, wherein the second SOA corresponds to a second operation wavelength, and
wherein the WDM circuitry is configured to:
(i) receive an optical signal at the first operation wavelength and provide the received optical signal to the first SOA for amplifying the optical signal, wherein reception of the optical signal at the first operation wavelength is based on a selection of the first operation wavelength, at a transmitter, in response to an instruction from at least one processor that a failure has occurred at the second SOA, or
(ii) receive the optical signal at the second operation wavelength and
provide the received optical signal to the second SOA for amplifying the optical signal, wherein reception of the optical signal at the second operation wavelength is based on a selection of the second operation wavelength, at the transmitter, in response to an instruction from the at least one processor that a failure has occurred at the first SOA.

2. The apparatus of claim 1, further comprising:
a third SOA, wherein the third SOA is configured to operate at a third operation wavelength, and
wherein the WDM circuitry is further configured to: (i) receive the optical signal at the third operation wavelength and (ii) provide the received optical signal to the third SOA for amplifying the optical signal.

3. The apparatus of claim 1, wherein (i) the first SOA is turned on and the second SOA is turned off when the first SOA amplifies the optical signal or (ii) the second SOA is turned on and the first SOA is turned off when the second SOA amplifies the optical signal.

4. The apparatus of claim 1, wherein the determination of whether the failure has occurred at the first or second SOA comprises the at least one processor further configured to determine whether the first or second SOA is in a failure mode or no current is being applied or drawn.

5. The apparatus of claim 1, wherein the apparatus is an optical repeater.

6. A substrate package comprising:
at least one optical combiner;
at least one optical switch;
a first semiconductor optical amplifier (SOA) coupled to the at least one optical combiner and the at least one optical switch; and
a second SOA coupled to the at least one optical combiner and the at least one optical switch, and
wherein the at least one optical combiner, the at least one optical switch, the first SOA, and the second SOA are integrated in the substrate package, and
wherein the at least one optical switch is configured to receive an optical signal from the at least one optical combiner and provide the optical signal to the first SOA or the second SOA for amplifying the optical signal.

7. The substrate package of claim 6, wherein the integration of the at least one optical combiner, the at least one optical switch, the first SOA, and the second SOA is performed via photonics integration, the photonics integration including one or more of the following: (i) InP integration, (ii) Si integration, (iii) Ge—Si integration, and (iv) heterogenous integration.

8. The substrate package of claim 6, wherein the at least one optical combiner is a polarization beam combiner and the at least one optical switch is an active polarization rotator.

9. The substrate package of claim 6, wherein the first SOA or the second SOA is selected for amplifying the optical signal by: (i) switching between the first SOA or the second SOA via the at least one optical switch and/or (ii) turning on or turning off the first SOA or the second SOA.

10. A method comprising:
transmitting an optical signal to an optical repeater, the optical repeater including at least a first semiconductor optical amplifier (SOA) and a second SOA, wherein the first SOA amplifies the optical signal transmitted at a first operation wavelength;

determining, via at least one processor, that the first SOA in the optical repeater is not functional or is in failure mode;

selecting the second SOA by selecting, at a transmitter, a second operation wavelength associated with the second SOA in response to an instruction from the at least one processor that a failure has occurred at the first SOA; and transmitting the optical signal at the second operation wavelength such that the second SOA amplifies the optical signal.

11. The method of claim 10, wherein the selecting of the second SOA comprises transmitting the optical signal at the second operation wavelength via a wavelength division multiplexing (WDM) transmitter.

12. The method of claim 10, wherein the optical repeater includes a third SOA, and the method further comprising:

determining, via the at least one processor, that the second SOA in the optical repeater is not functional or is in failure mode;

selecting the third SOA by selecting, at the transmitter, a third operation wavelength associated with the third SOA in response to an instruction from the at least one processor that a failure has occurred at the second SOA; and transmitting a third optical signal at the third operation wavelength such that the third SOA amplifies the third optical signal.

* * * * *